(12) United States Patent  (10) Patent No.: US 8,970,467 B2
Chan et al.  (45) Date of Patent: Mar. 3, 2015

(54) SHIFT REGISTER AND GATE DRIVER WITH COMPENSATION CONTROL

(75) Inventors: Chien-Ting Chan, Yongjing Township, Changhua County (TW); Wen-Chun Wang, Taichung (TW); Hsi-Rong Han, Wurih Township, Taichung County (TW); Kuo-Chang Su, Shanhua Township, Tainan County (TW)

(73) Assignee: Wintek Corporation, Taichung (TW)

( * ) Notice: Subject to any disclaimer, the term of this patent is extended or adjusted under 35 U.S.C. 154(b) by 965 days.

(21) Appl. No.: 12/727,287

(22) Filed: Mar. 19, 2010

(65) Prior Publication Data

US 2010/0245300 A1 Sep. 30, 2010

(30) Foreign Application Priority Data

Mar. 25, 2009 (TW) .............................. 98109801 A

(51) Int. Cl.
G09G 3/36 (2006.01)
G11C 19/28 (2006.01)

(52) U.S. Cl.
CPC .............. *G11C 19/28* (2013.01); *G09G 3/3677* (2013.01); *G09G 2310/0286* (2013.01)
USPC ....................................................... 345/100

(58) Field of Classification Search
USPC .......... 345/98, 100, 204, 211; 377/64, 70, 71, 377/75, 78
See application file for complete search history.

(56) References Cited

U.S. PATENT DOCUMENTS

| | | | | |
|---|---|---|---|---|
| 2005/0201508 A1* | 9/2005 | Shin et al. | ........................ | 377/10 |
| 2006/0001637 A1* | 1/2006 | Pak et al. | ........................ | 345/100 |
| 2006/0291610 A1* | 12/2006 | Lo et al. | ........................ | 377/64 |
| 2007/0007557 A1* | 1/2007 | Kwak et al. | ........................ | 257/239 |
| 2007/0075627 A1* | 4/2007 | Kimura et al. | ........................ | 313/503 |
| 2008/0001899 A1* | 1/2008 | Chan et al. | ........................ | 345/100 |
| 2008/0016139 A1* | 1/2008 | Tsai et al. | ........................ | 708/503 |
| 2008/0079701 A1* | 4/2008 | Shin et al. | ........................ | 345/204 |
| 2010/0013823 A1* | 1/2010 | Kwon et al. | ........................ | 345/214 |
| 2010/0033455 A1* | 2/2010 | Kwak et al. | ........................ | 345/204 |

* cited by examiner

*Primary Examiner* — Pegeman Karimi

(74) *Attorney, Agent, or Firm* — McClure, Qualey & Rodack, LLP

(57) ABSTRACT

A shift register including a plurality of multi-stage shift register circuits is provided. The $m^{th}$ stage shift register circuit includes a node, a shift register unit and a control circuit. A first control signal, enabled in an $m^{th}$ period, is defined on the node. The shift register unit is controlled by an $(m-1)^{th}$ stage output signal provided by an $(m-1)^{th}$ stage shift register circuit and a clock signal for providing the enabled $m^{th}$ stage output signal in the $m^{th}$ period, and controlled by an $(m+1)^{th}$ stage second control signal provided by an $(m+1)^{th}$ stage shift register circuit for providing a disenabled $m^{th}$ stage output signal in the $(m+1)^{th}$ period. The control circuit, controlled by the clock signal, provides and outputs an $m^{th}$ stage second control signal to the $(m-1)^{th}$ stage shift register circuit according to the $m^{th}$ stage first control signal, wherein m is a natural number greater than 1.

17 Claims, 23 Drawing Sheets

SHIFT REGISTER AND GATE DRIVER WITH COMPENSATION CONTROL

This application claims the benefit of Taiwan application Serial No. 98109801, filed Mar. 25, 2009, the subject matter of which is incorporated herein by reference.

BACKGROUND OF THE INVENTION

1. Field of the Invention

The invention relates in general to a shift register, and more particularly to a shift register whose shift register circuit of each stage has a control circuit which provides a control signal for compensating the shift register circuit of the previous stage.

2. Description of the Related Art

With the rapid advance in science and technology, liquid crystal display has been widely used in the display of electronic products such as TV, computer screen, notebook computer, mobile phone and personal digital assistant (PDA). A liquid crystal display includes a source driver, a gate driver and a liquid crystal display (LCD) panel, wherein the LCD panel has a pixel array, the gate driver sequentially turns on the corresponding pixel row of the pixel array for outputting the pixel data to the pixel, so as to display the image.

The current technology normally implements the gate driver, which sequentially turns on the corresponding pixel row of the pixel array, by the shift register. The gate driver has much to do with the display quality of the liquid crystal display. Therefore, how to design a shift register whose output signal has slight distortion for improving the efficiency of the gate driver and the display quality of the liquid crystal display has become a focus to the display industry.

SUMMARY OF THE INVENTION

The invention is directed to a shift register. The shift register circuit of each stage includes a control circuit used for providing a control signal to compensate the shift register circuit of the previous stage. Compared with the conventional shift register, the shift register of the invention has the advantages of effectively reducing the load for the output signal provided by the shift register circuit of each stage and improving the distortion occurring to the shift register circuit of each stage.

According to a first aspect of the present invention, a shift register is provided. The shift register includes a plurality of multi-stage shift register circuits respectively used for outputting a plurality of shift output signals. Of the multi-stage shift register circuits, an $m^{th}$ stage shift register circuit includes an $m^{th}$ stage first node, an $m^{th}$ stage shift register unit and an $m^{th}$ stage control circuit. An $m^{th}$ stage first control signal enabled in an $m^{th}$ period is defined on the $m^{th}$ stage first node. The $m^{th}$ stage shift register unit is controlled by an $(m-1)^{th}$ stage output signal, which is provided by the $(m-1)^{th}$ stage shift register circuit and enabled in the $(m-1)^{th}$ period, and a first clock signal for providing an enabled $m^{th}$ stage output signal in the $m^{th}$ period, and is controlled by an $(m+1)^{th}$ stage second control signal provided by an $(m+1)^{th}$ stage shift register circuit for providing a disenabled $m^{th}$ stage output signal in the $(m+1)^{th}$ period. The $m^{th}$ stage control circuit is controlled by a first clock signal for providing an $m^{th}$ stage second control signal and outputting the $m^{th}$ stage second control signal to the $(m-1)^{th}$ stage shift register circuit according to the $m^{th}$ stage first control signal, wherein m is a natural number greater than 1.

According to a second aspect of the present invention, a gate driver used for driving a display panel is provided. The gate driver includes a shift register, which includes a plurality of multi-stage shift register circuits respectively used for outputting a plurality of shift output signals. Of the multi-stage shift register circuits, an $m^{th}$ stage shift register circuit includes an $m^{th}$ stage first node, an $m^{th}$ stage shift register unit and an $m^{th}$ stage control circuit. An $m^{th}$ stage first control signal enabled in an $m^{th}$ period is defined on the $m^{th}$ stage first node. The $m^{th}$ stage shift register unit is controlled by an $(m-1)^{th}$ stage output signal which is provided by an $(m-1)^{th}$ stage shift register circuit and enabled in the $(m-1)^{th}$ period, and a first clock signal for providing an enabled $m^{th}$ stage output signal in the $m^{th}$ period, and is controlled by an $(m+1)^{th}$ stage second control signal provided by an $(m+1)^{th}$ stage shift register circuit for providing a disenabled $m^{th}$ stage output signal in the $(m+1)^{th}$ period. The $m^{th}$ stage control circuit is controlled by first clock signal for providing an $m^{th}$ stage second control signal and outputting the $m^{th}$ stage second control signal to the $(m-1)^{th}$ stage shift register circuit according to the $m^{th}$ stage first control signal, wherein m is a natural number greater than 1.

The invention will become apparent from the following detailed description of the preferred but non-limiting embodiments. The following description is made with reference to the accompanying drawings.

DETAILED DESCRIPTION OF THE INVENTION

In the present embodiment of the invention, the shift register circuit of each stage includes a control circuit which provides a control signal for compensating the shift register circuit of the previous stage.

First Embodiment

Figure 1:
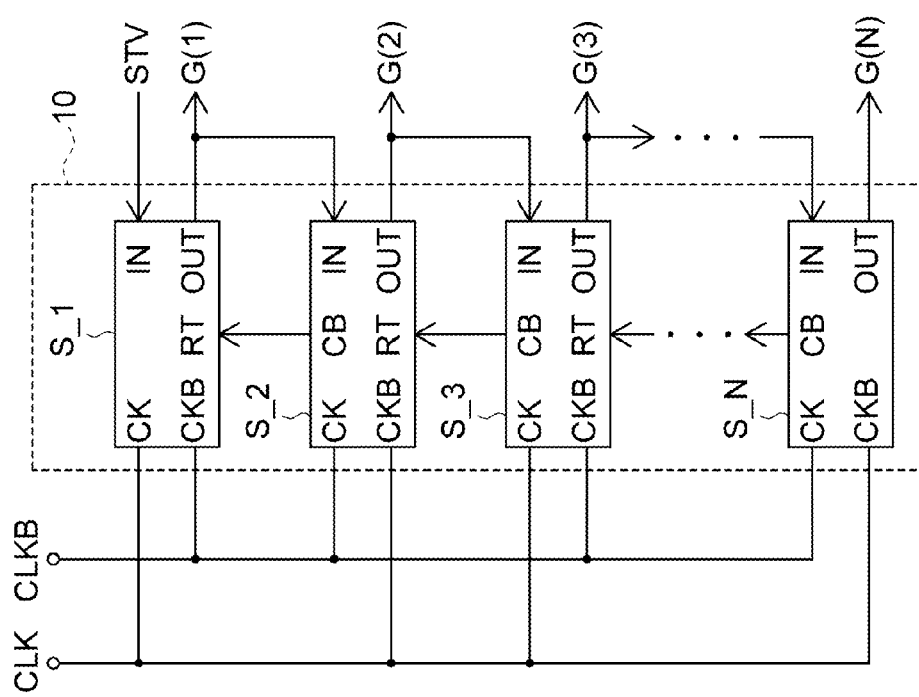
FIG. 1 shows a block diagram of a gate driver using a shift register of a first embodiment of the invention.
Figure 2:
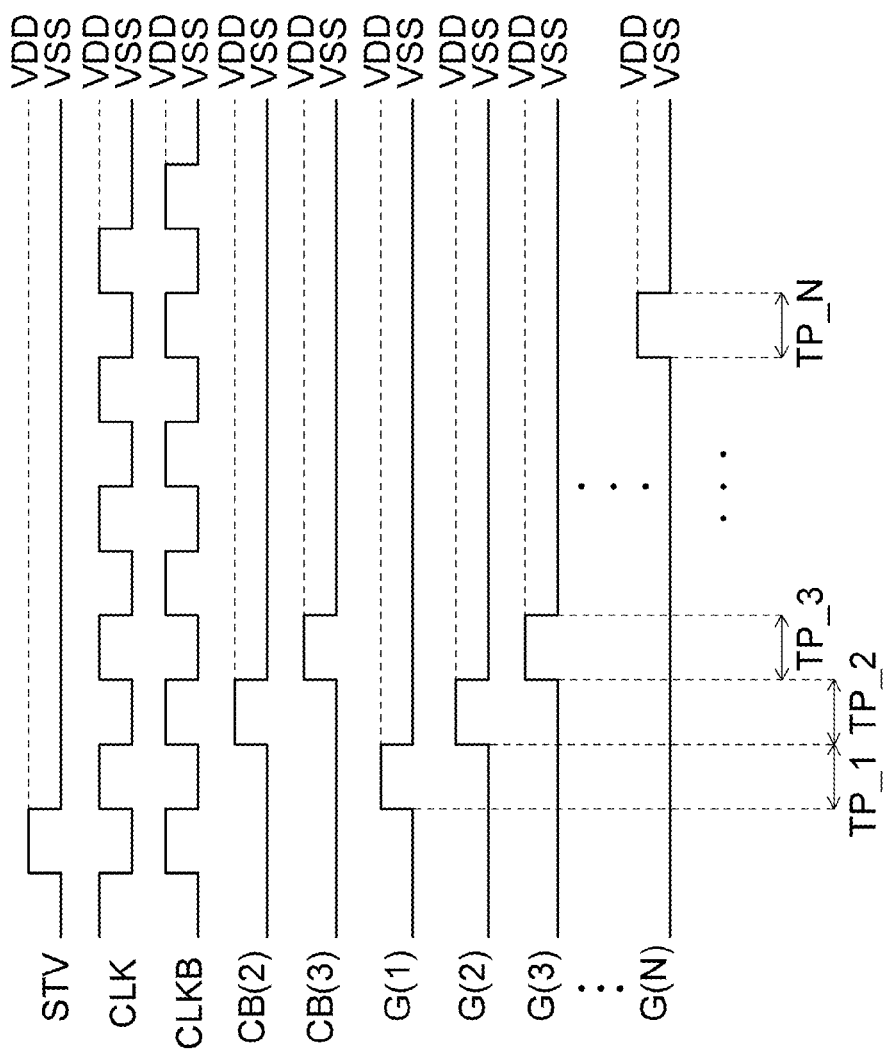
FIG. 2 shows a relevant signal clock diagram of a shift register of FIG. 1.

The shift register of the present embodiment of the invention is used for implementing the gate driver. Referring to FIG. 1 and FIG. 2. FIG. 1 shows a block diagram of a gate driver using a shift register of a first embodiment of the invention. FIG. 2 shows a relevant signal clock diagram of a shift register of FIG. 1. The gate driver 1 includes a shift register 10, the shift register 10, in response to the initial signal STV, provides N gate signals G (1), G (2), G (3), G (4), . . . , G (N) for driving N rows of pixels of a display panel (not illustrated), wherein N is a natural number greater than 1. In an example, N is an even number.

The shift register 10 includes N shift register circuits S_1, S_2, S_3, . . . , S_N. In an example, the N stage shift register circuits S_1-S_N of the shift register 10 have similar circuit structures. In the shift register 10, the operation of the shift register circuit S_m used for driving the m$^{th}$ row pixel of a display panel is exemplified below, wherein m is a natural number smaller than or equal to N.

Figure 3:
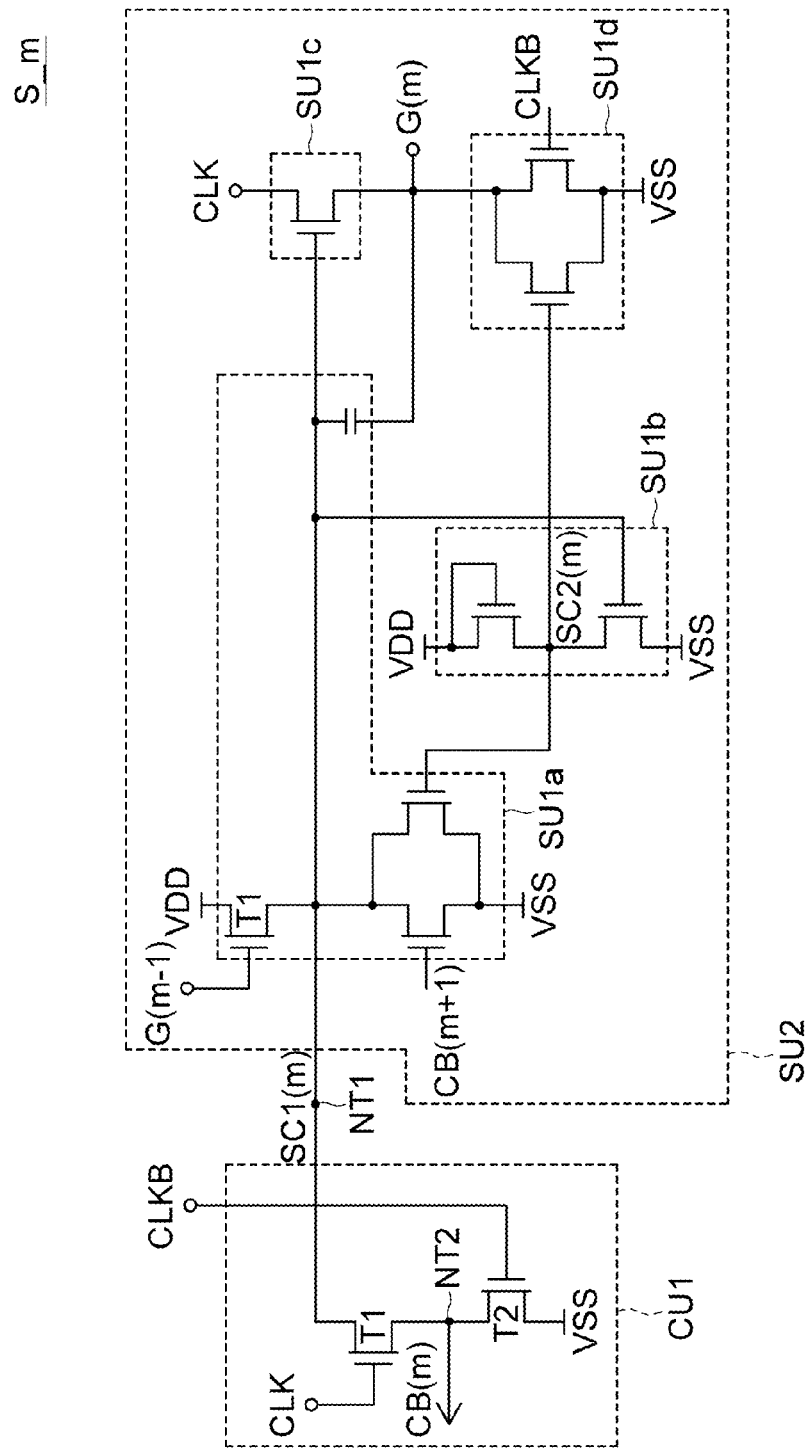
FIG. 3 shows a detailed circuit diagram of a shift register circuit of FIG. 1.
Figure 4:
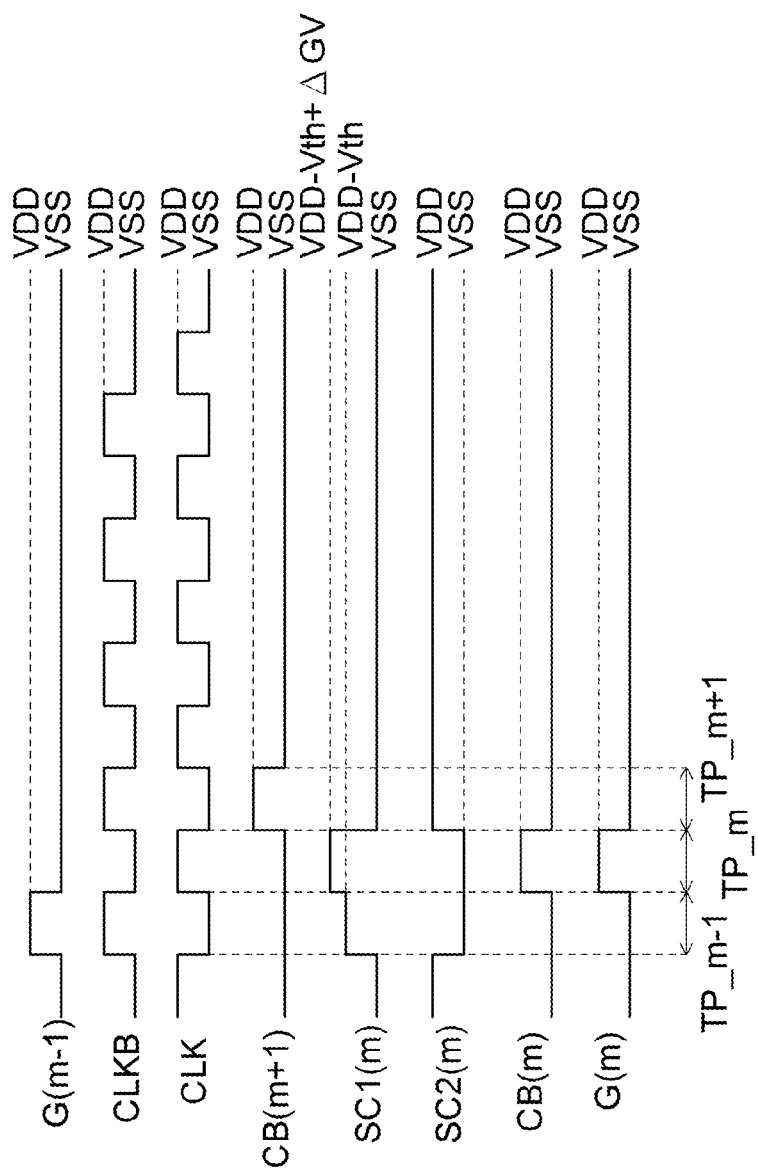
FIG. 4 shows a relevant signal clock diagram of a shift register circuit of FIG. 3.

Referring to FIG. 3 and FIG. 4. FIG. 3 shows a detailed circuit diagram of a shift register circuit of FIG. 1. FIG. 4 shows a relevant signal clock diagram of a shift register circuit of FIG. 3. The shift register circuit S_m includes a node NT1, a shift register unit SU1 and a control circuit CU1. A control signal SC1 (m) is defined on the node NT1. The shift register unit SU1 is controlled by a gate signal G (m−1) provided by the shift register circuit S_m−1 and a clock signal CLK, wherein an enabled gate signal G (m) is provided in the period TP_m. The shift register unit SU1 is further controlled by a control signal CB (m+1) provided by a shift register circuit S_m+1 (that is, the shift register circuit used for providing a gate signal G (m+1)), wherein a disenabled gate signal G (m) is provided in the period TP_m+1.

In an example, the shift register unit SU1 includes two driving units SU1a and SU1b and two level control units SU1c and SU1d. The level control unit SU1c provides a clock signal CLK used as a gate signal G (m). The input ends of the driving unit SU1a and the level control unit SU1c are coupled to the node NT1. The driving unit SU1a, in response to the front edge of the gate signal G (m−1), provides an enabled control signal SC1 (m) in the periods TP_m−1 and TP_m for turning on the level control unit SU1c to provide a clock signal CLK used as a gate signal G (m).

In the period TP_m, the driving unit SU1a, by means of the charge coupling effect of the capacitor, drives the control signal SC1 (m) whose level is higher than the system high voltage signal VDD to drive the level control unit SU1c to generate a gate signal G (m) whose level substantially equals the system high voltage signal VDD according to the clock signal CLK whose level is close to the system high voltage signal VDD. For example, the level of the control signal SC1 (m) equals VDD−Vth1+ΔV, wherein the difference voltage ΔV satisfies the equation:

$$\Delta V = \frac{C_{gs}}{C_{p1} + C_{gs}}(VDD - VSS)$$

Wherein Cgs is a parasitic capacitor inside the transistor of the level control unit SU1c, and Cp1 is an equivalent capacitor viewed at the node NT1.

The driving unit SU1a is further controlled by the control signal CB (m+1) provided by the shift register circuit S_m+1, and the disenabled control signal SC1 (m) is provided in the period TP_m+1 to turn off the level control unit SU1c.

The level control unit SU1d provides a reference voltage signal VSS used as a gate signal G (m). For example, the reference voltage signal VSS is at a low voltage level. The driving unit SU1b, in response to the front edge of the control signal SC1 (m), provides a disenabled control signal SC2 (m) in the periods TP_m−1 and TP_m to disenable the level control unit SU1d. The driving unit SU1b, in response to the rear edge of the control signal SC1 (m), provides an enabled control signal SC2 (m) in the period TP_m+1 to enable the level control unit SU1d and make the level of the gate signal G (m) equal to the level of the reference voltage signal VSS.

The control circuit CU1, controlled by the clock signal CLK, provides and outputs the control signal CB (m) to the shift register circuit S_m−1 according to the control signal SC1 (m). For example, the control circuit CU1 includes a node NT2, and two transistors T1 and T2, wherein a control signal CB (m) is defined on the node NT2.

In an example, the transistors T1 and T2 are both exemplified by an N-type metal oxide semiconductor (NMOS) transistors. The drain of the transistor T1 is coupled to the node NT1, the source of the transistor T1 is coupled to the node NT2, and the gate receives the clock signal CLK. The drain of the transistor T2 is coupled to the node NT2, the source of the transistor T2 receives the reference voltage signal VSS, and the gate receives the clock signal CLKB. Wherein, the clock signals CLK and CLKB are inversed.

In greater details, in the periods TP_m−1 and TP_m+1, the clock signals CLKB and CLK respectively equal to a high voltage signal VDD and a reference voltage signal VSS. Meanwhile, the transistor T2 is turned on and the transistor T1 is turned off, so that the control signal CB (m) equals the reference voltage signal VSS.

In the period TP_m, the clock signals CLK and CLKB respectively equal to a high voltage signal VDD and a reference voltage VSS. Meanwhile, the transistor T1 is turned on and the transistor T2 is turned off, so that the transistor T1 provides the control signal SC1 (m) whose level equals VDD−Vth1+ΔV as a control signal CB (m).

Figure 5:
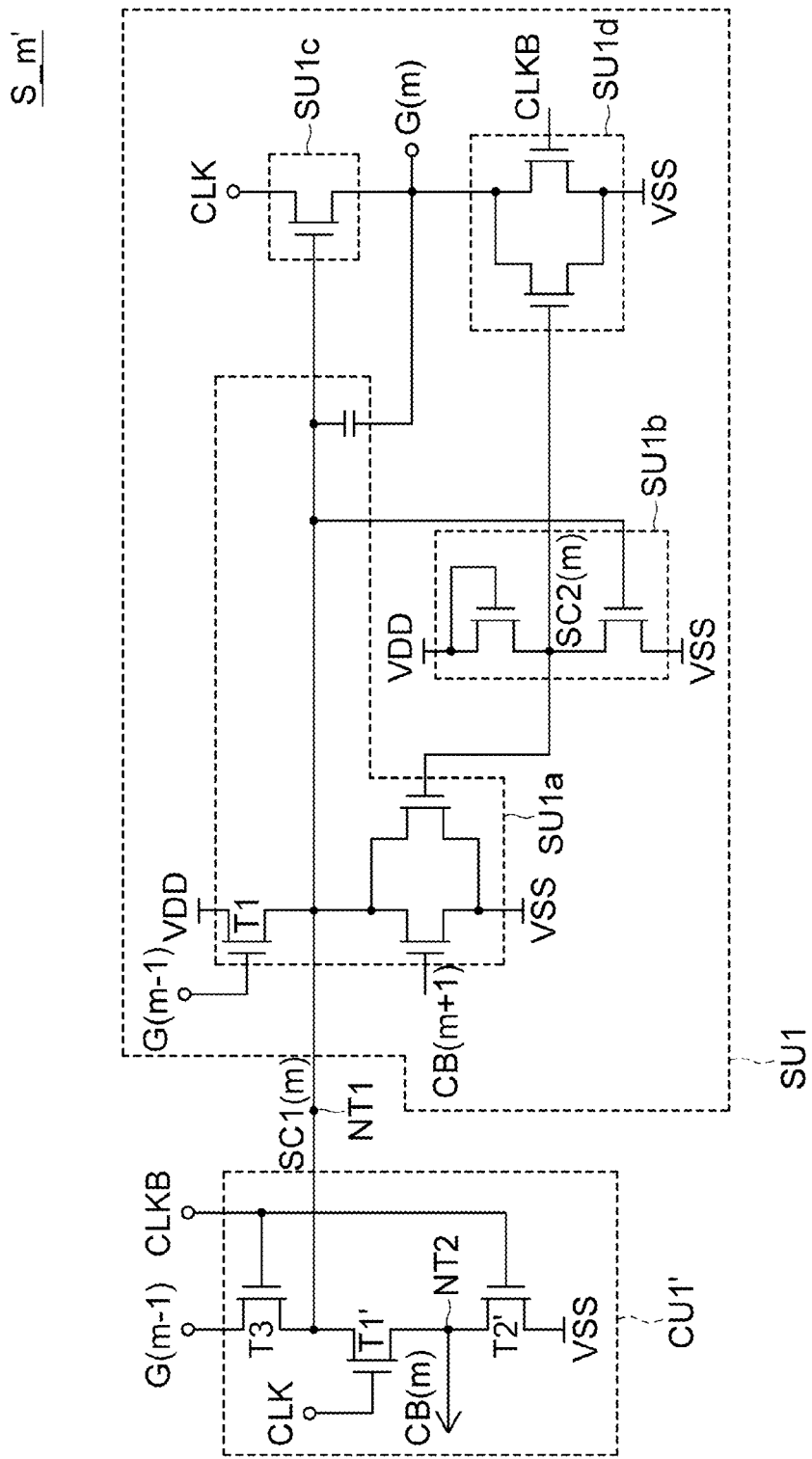
FIG. 5 shows another detailed circuit diagram of a shift register circuit of FIG. 1.

In the present embodiment of the invention, the control circuit CU1 includes a node NT2 and two transistors T1 and T2. However, the control circuit CU1 of the present embodiment of the invention is not limited thereto. In another example, the control circuit CU1' further includes a transistor T3 as indicated in FIG. 5. In the period TP_m−1, the transistor T3 is turned on to increase the level of the control signal SC1 (m) to VDD−Vth. In the period TP_m, the transistor T3 is turned off. In the period TP_m+1, the transistor T3 is turned on to help the driving unit SU1a to step down the level of the control signal SC1 (m) to the level of the reference voltage signal VSS.

In the present embodiment of the invention, the shift register circuit S_m may have the circuit as illustrated in FIG. 3. However, the shift register circuit S_m of the present embodiment of the invention is not limited thereto. In other examples, other types of shift register units can be combined with the control circuit CU1 of the present embodiment of the invention to output the shift signals which are substantially similar.

Figure 6:
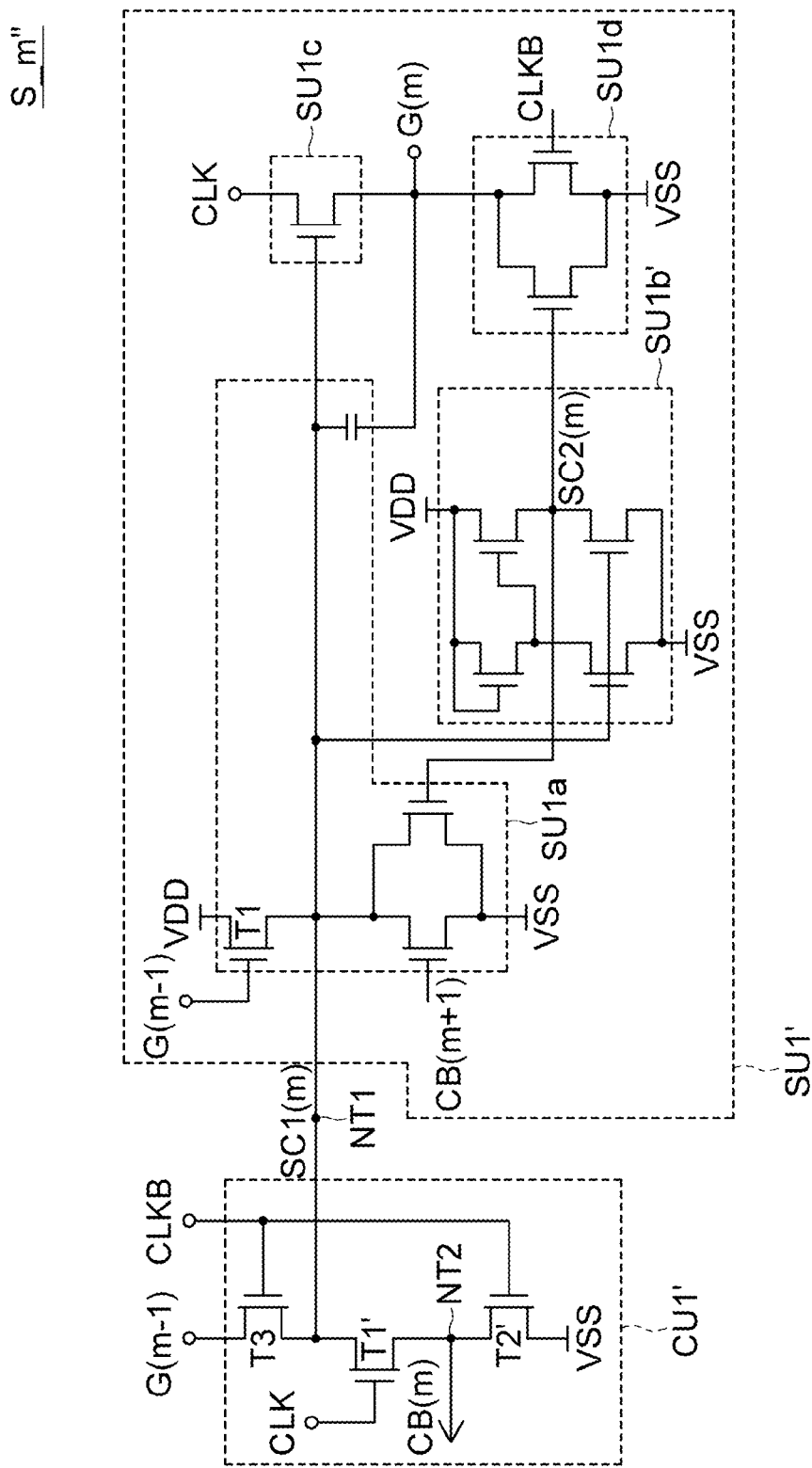
FIG. 6 shows yet another detailed circuit diagram of a shift register circuit of FIG. 1.

In an example, the shift register circuit S_m of the present embodiment of the invention may have the circuit as illustrated in FIG. 6. In the present example, the driving unit SU1b' adopts another output buffer structure, and, in response to the control signal SC1 (m), provides a control signal SC2 (m) which is substantially inversed to the control signal SC1 (m).

Figure 7:
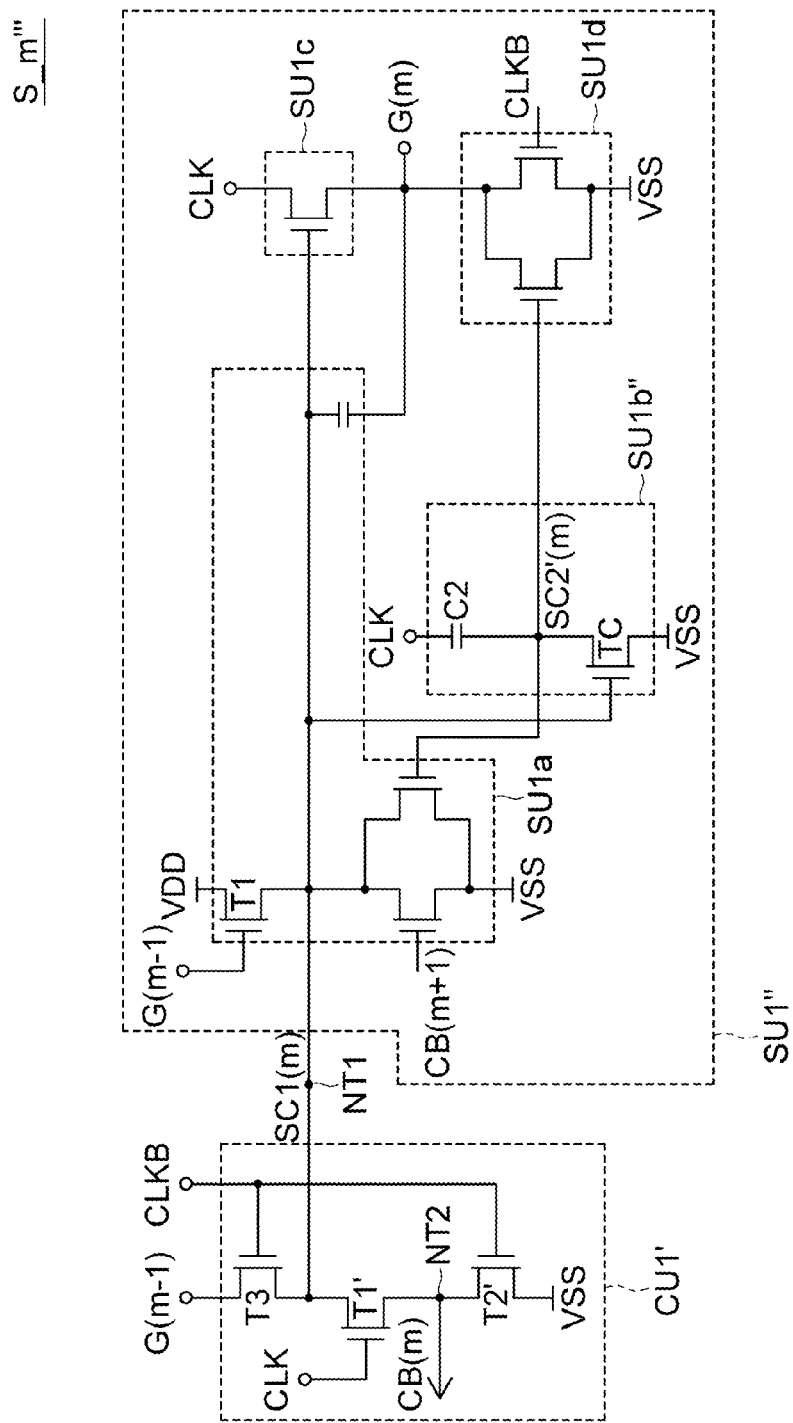
FIG. 7 shows yet another detailed circuit diagram of a shift register circuit of FIG. 1.
Figure 8:
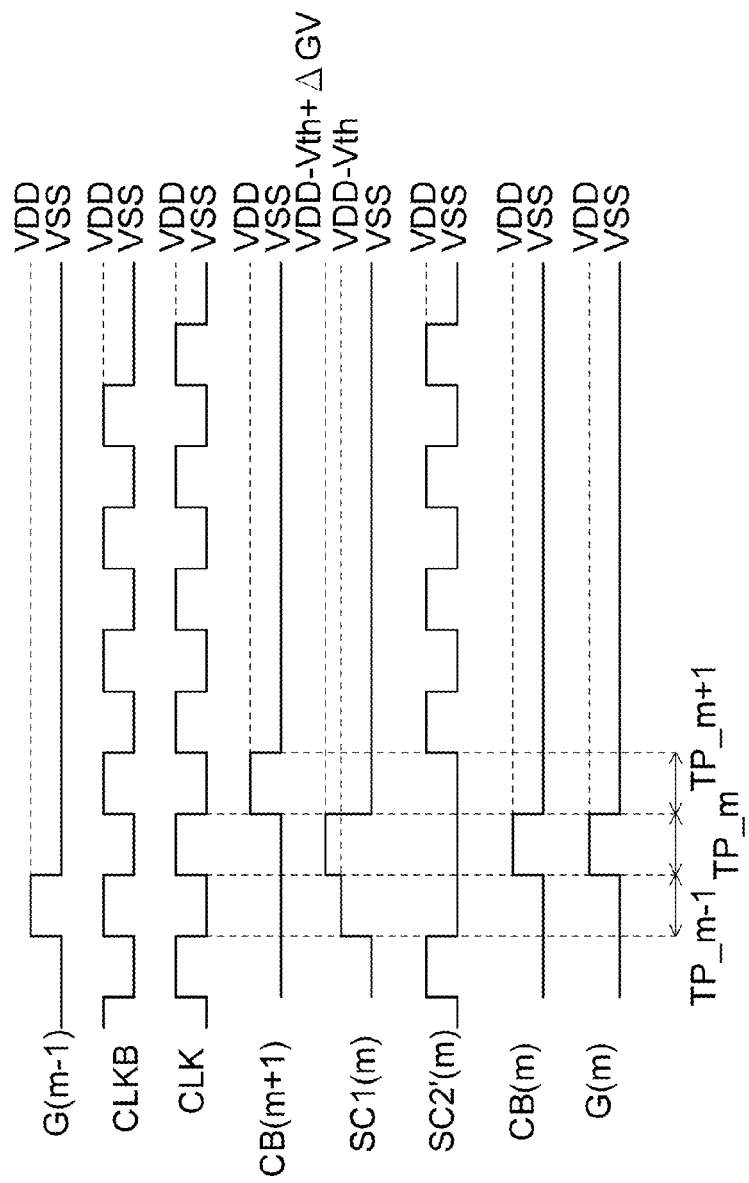
FIG. 8 shows a relevant signal clock diagram of a shift register circuit of FIG. 7.
Figure 9A:
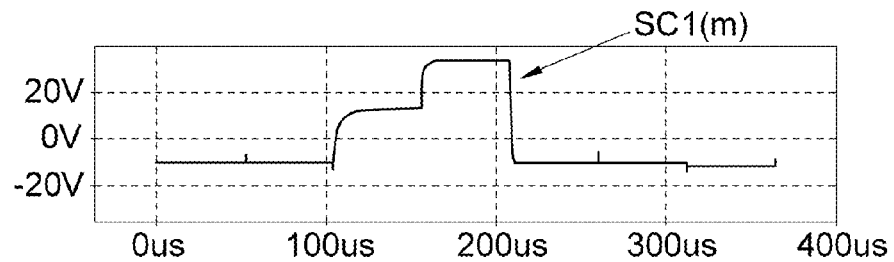
FIG. 9A-9D shows a signal simulation diagram of a shift register circuit of FIG. 7.
Figure 9B:
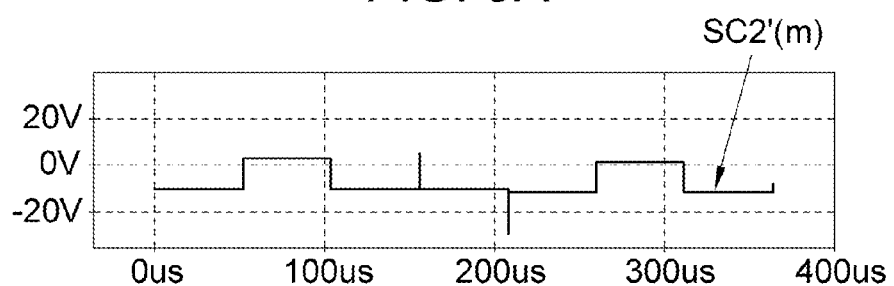
Figure 9C:
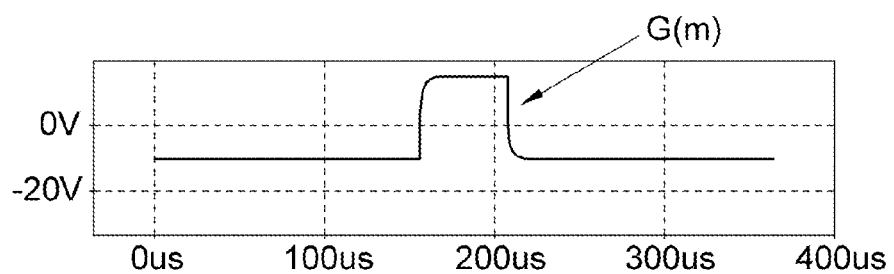
Figure 9D:
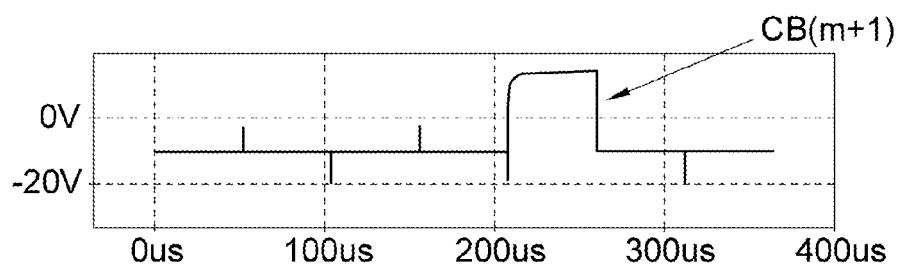

In another example, the shift register circuit S_m of the present embodiment of the invention may have the circuit as illustrated in FIG. 7. In the present example, the driving unit SU1b" adopts another control circuit structure. Meanwhile, the relevant signal clock diagram of the shift register circuit S_m''' is illustrated in FIG. 8. The driving unit SU1b" includes a capacitor C2 and a transistor TC. In the periods TP_m−1 and TP_m−2, the transistor TC controlled by a control signal SC1 (m) having high voltage level is turned on to control the control signal SC2' (m) to be substantially equal to the reference voltage signal VSS.

In the periods other than the periods TP_m−1 and TP_m−2, the transistor TC continually remains off, and the level of the control signal SC2' (m) is switched between the high voltage signal VDD and the reference voltage signal VSS according to the clock signal CLK received by the capacitor C2.

Under the simulation conditions that the resolution is QVGA, and the load of the resistive capacitor is 15 kilo-ohm (KO) and 37 pico Farad (pF), the shift register circuit S_m''' of FIG. 7 is simulated, and the simulation results of the control signals SC1 (m), SC2' (m), the gate signal G (m) and the control signal CB (m+1) are respectively indicated in FIG. 9A, FIG. 9B, FIG. 9C and FIG. 9D. Thus, the shift register circuit S_m''' of the present embodiment of the invention, in response to the control signal CB (m+1), can effectively step down the gate signal G (m) to the level of the reference voltage signal VSS in the period TP_m+1, wherein the level of the control signal CB (m+1) is substantially close to the level of the gate signal G (m), that is, close to the high voltage signal VDD.

Second Embodiment

Figure 10:
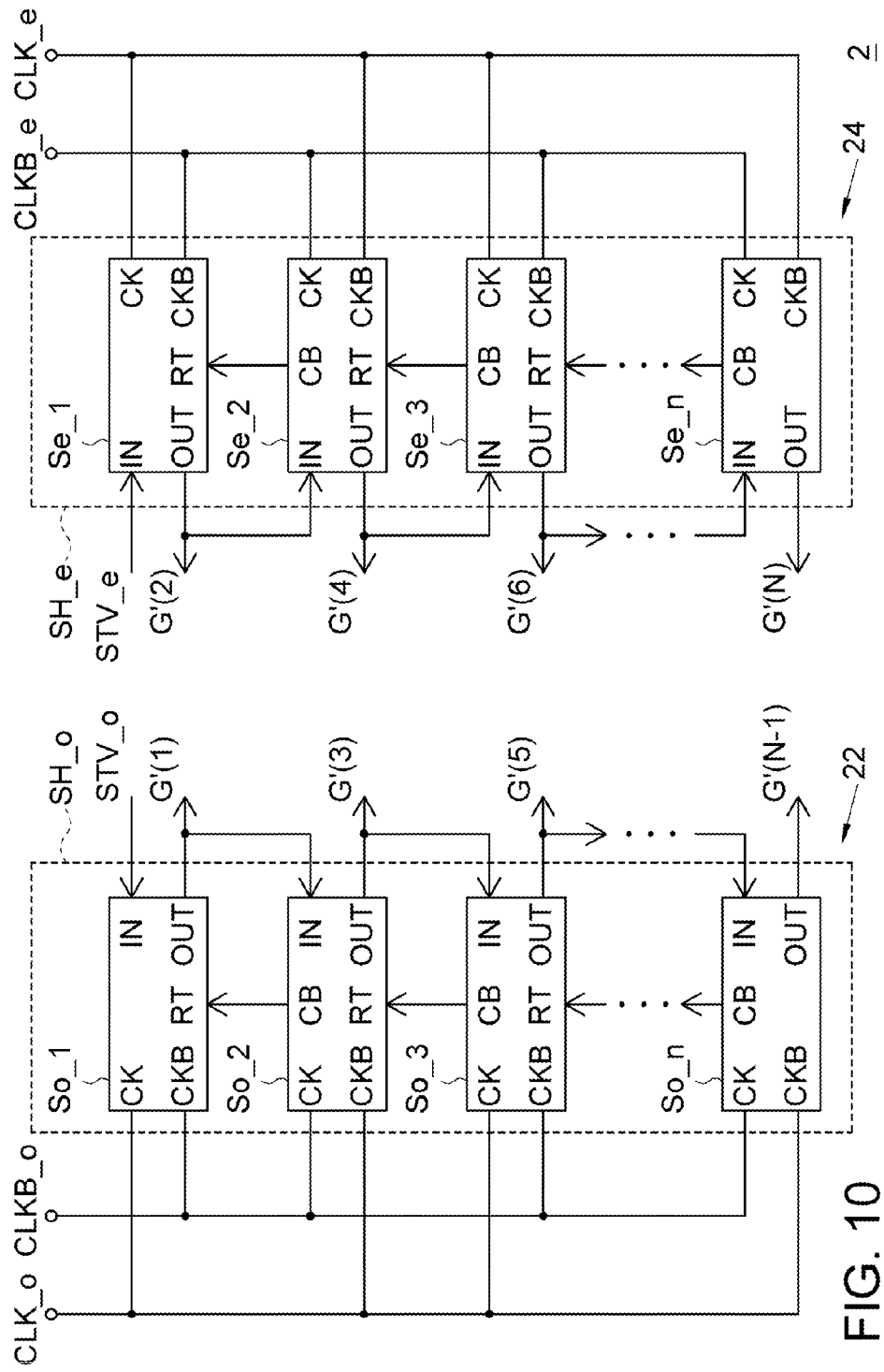
FIG. 10 shows a block diagram of a gate driver using a shift register of a second embodiment of the invention.
Figure 11:
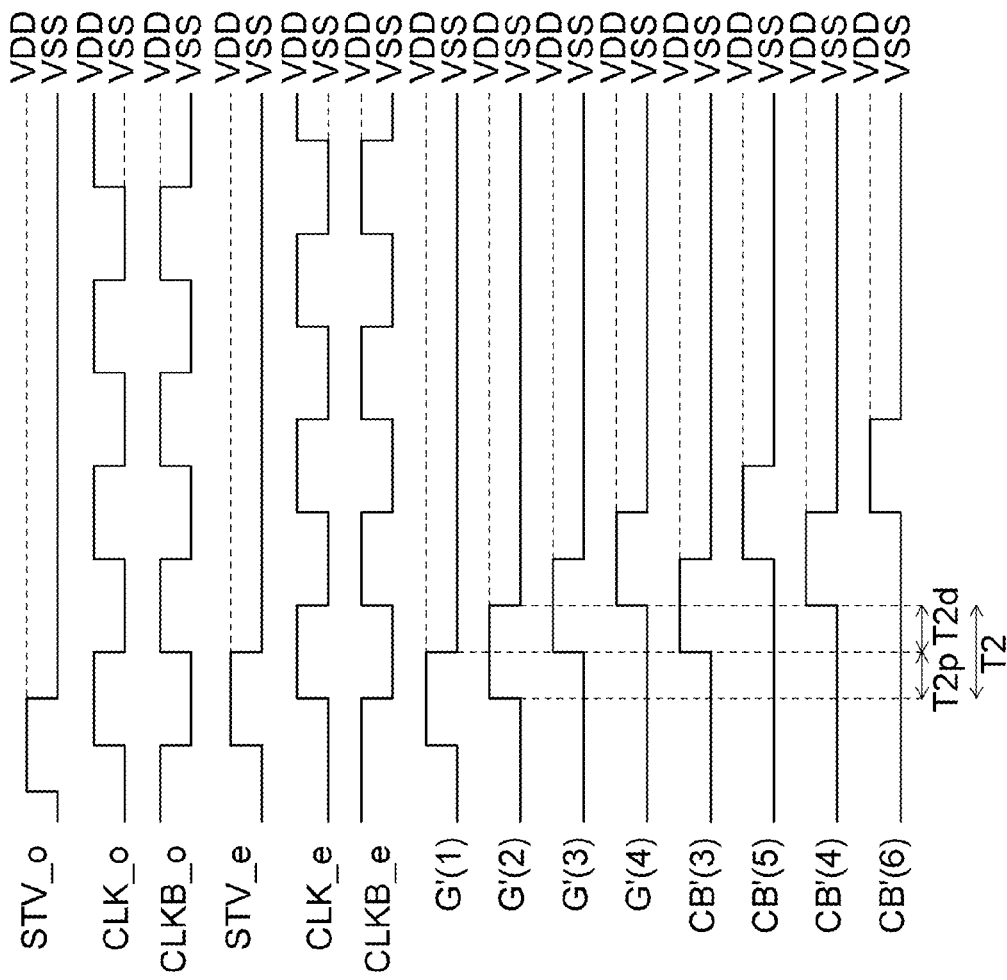
FIG. 11 shows a relevant signal clock diagram of a shift register of FIG. 10.

The shift register of the present embodiment of the invention is used for implementing the odd-order gate driving units and the even-order gate driving units of a dual-gate driver scan. Referring to FIG. 10 and FIG. 11. FIG. 10 shows a block diagram of a gate driver using a shift register of a second embodiment of the invention. FIG. 11 shows a relevant signal clock diagram of a shift register of FIG. 10. The gate driver 2 of the present embodiment of the invention differs with the gate driver 1 of the first embodiment in that the gate driver 2 includes the odd-order gate driving units 22 and even-order gate driving units 24, and provides odd-order gate signals G' (1), G' (3), G' (5), . . . , G' (N−1) of the gate signals G' (1)~G' (N) in response to an initial signal STV_o and provides the even-order gate signals G' (2), G' (4), G' (6), . . . , G' (N) of the gate signal G' (1)~G' (N) in response to an initial signal STV_e.

For example, the gate signals G' (1)~G' (N) are gate signals with pre-charge function, the enabling period of each of the gate signals G' (1)~G' (N) includes a pre-charge period and a data writing period. In terms of the gate signal G' (2), the enabling the period T_2 includes a pre-charge period T2p and a data writing period T2, wherein the pre-charge period T2p corresponds to the data writing period of the gate signal G' (1), and the data writing period T2d corresponds to the pre-charge period of gate signal G' (3).

In the pre-charge period T2p (that is, the data writing period of the gate signal G' (1)), the data driver (not illustrated) provides the pixel data corresponding to the first row pixel of a display panel, wherein the pixel data corresponding to the first row pixel are written to the first row pixel and make the first row pixel for showing the corresponding image frame. The pixel data corresponding to the first row pixel are also written to the second row pixel so that data pre-charge operation is performed to the second row pixel.

In the data writing period T2d (that is, the pre-charge period of the gate signal G' (3)), the data driver provides the pixel data corresponding to the second row pixel, wherein the pixel data are written to the second row pixel and make the second row pixel show the corresponding image frame. The pixel data corresponding to the second row pixel are also written to the third row pixel, so that data pre-charge operation is performed to the third row pixel.

The odd-order gate driving units 22 and the even-order gate driving units 24 of the present embodiment of the invention are respectively implemented by the shift register SH_o and the shift register SH_e. The shift register SH_o and the shift register SH_e respectively include n-stage shift register circuits So_1, So_2, So_3, . . . , So_n and n-stage shift register circuits Se_1, Se_2, Se_3, . . . , Se_n, wherein n equals N/2. In an example, in the shift register SH_o and the shift register SH_e, each stage of shift register circuit has similar circuit structure, and is exemplified by the operation of the $m^{th}$ stage shift register circuit So_m of the shift register SH_o used for driving the $m^{th}$ row pixel of the display panel, wherein m is a natural number smaller than or equal to n, and M is a natural number smaller than or equal to N.

Figure 12:
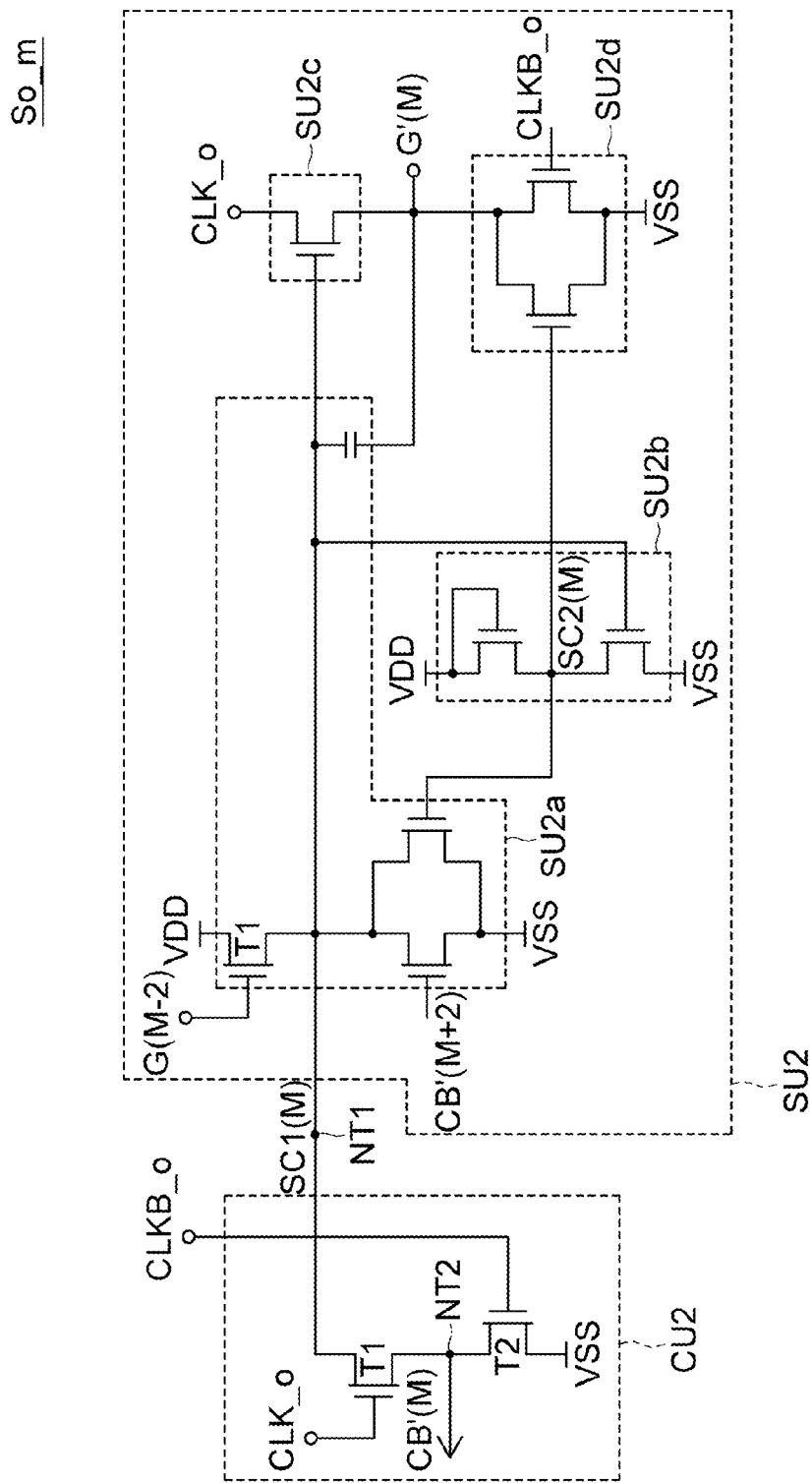
FIG. 12 shows a detailed circuit diagram of a shift register circuit of FIG. 10.
Figure 13:
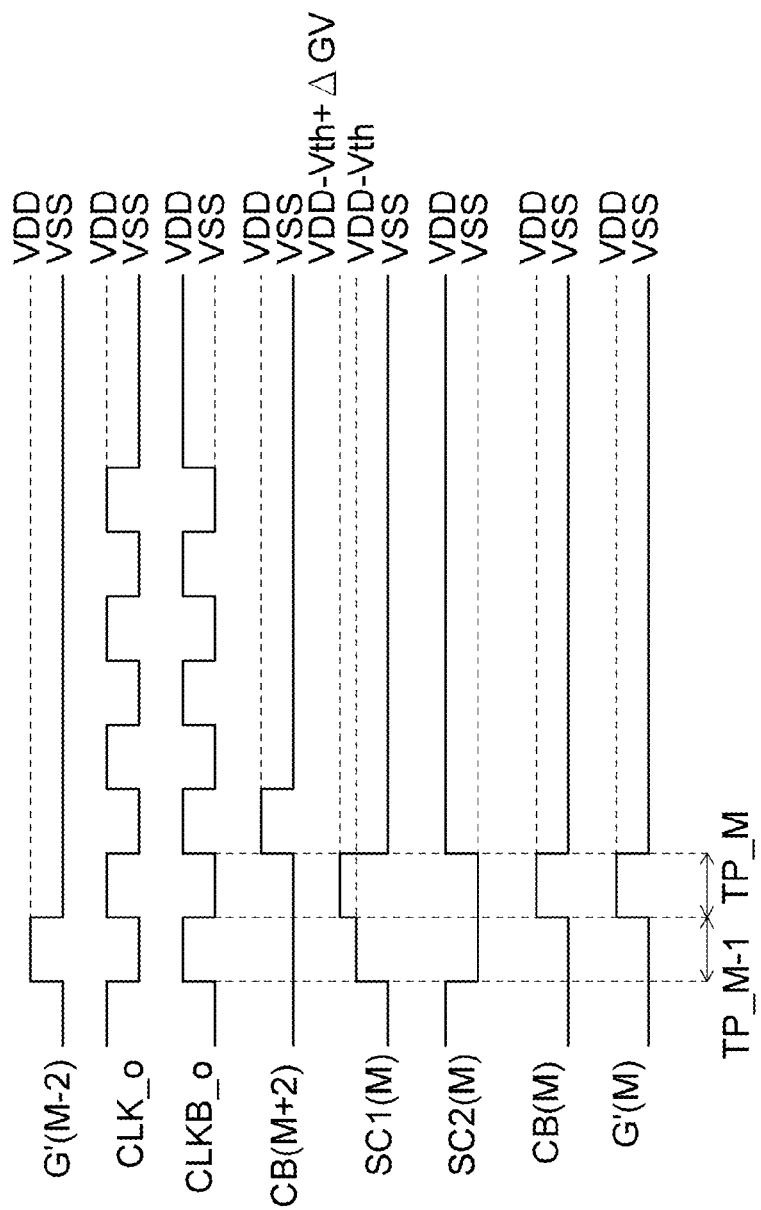
FIG. 13 shows a relevant signal clock diagram of a shift register circuit of FIG. 12.

Referring to FIG. 12 and FIG. 13. FIG. 12 shows a detailed circuit diagram of a shift register circuit of FIG. 10. FIG. 13 shows a relevant signal clock diagram of a shift register circuit of FIG. 12. The shift register circuit So_m includes a node NT1, a shift register unit SU2 and a control circuit CU2. The shift register unit SU2 of the present embodiment of the invention includes two driving units SU2a and SU2b and two level control units SU2c and SU2d, and the circuit structure of the two driving units SU2a and SU2b and the two level control units SU2c and SU2d are similar to the driving units SU1a and SU1b and the level control units SU1c and SU1d of the shift register unit SU1, and are not repeated here.

The shift register SU2 of the present embodiment of the invention differs with the shift register SU1 in that the shift register SU2 is controlled by an $(m-2)^{th}$ stage gate signal G' (M−2) provided by the $(m-1)^{th}$ stage shift register circuit So_m−1 (that is, the shift register circuit used for providing a gate signal G' (M−2)) and a clock signal CLK_o for providing an enabled gate signal G' (M) in the period TP_M, and is controlled by the control signal CB (M+2) provided by the $(m+1)^{th}$ stage shift register circuit So_m+1 (that is, the shift register circuit used for providing a gate signal G' (M+2)) for providing a disenabled gate signal G' (M) in the period TP_M+1.

The control circuit CU2, controlled by the clock signal CLK_o, provides and outputs a control signal CB (M) to the $(m-1)^{th}$ stage shift register circuit So_m−1 according to control signal SC1 (M). For example, the control circuit CU2 and the control circuit CU1 of the first embodiment have similar circuit structure and are not repeated here.

Figure 14:
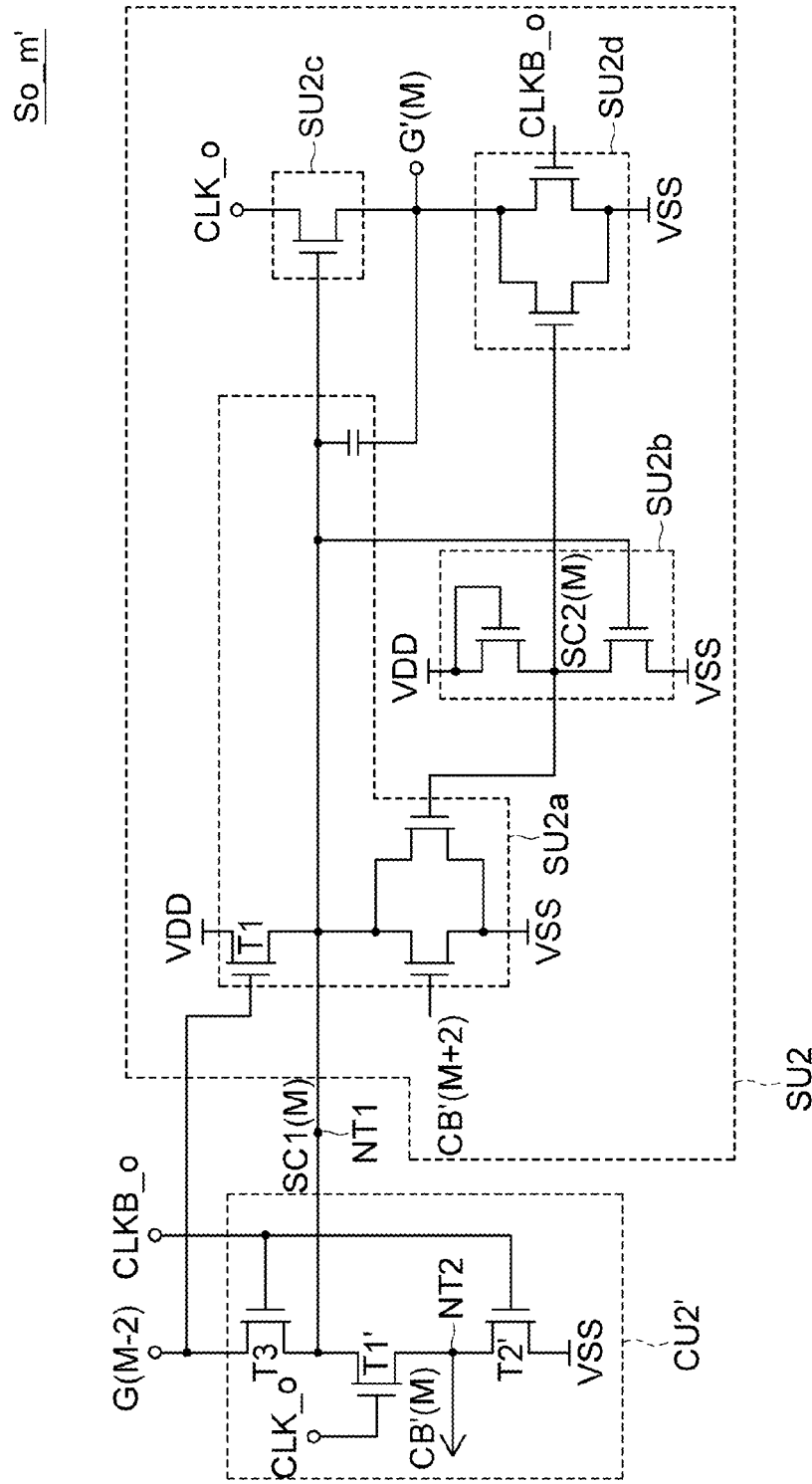
FIG. 14 shows another detailed circuit diagram of a shift register circuit of FIG. 10.
Figure 15:
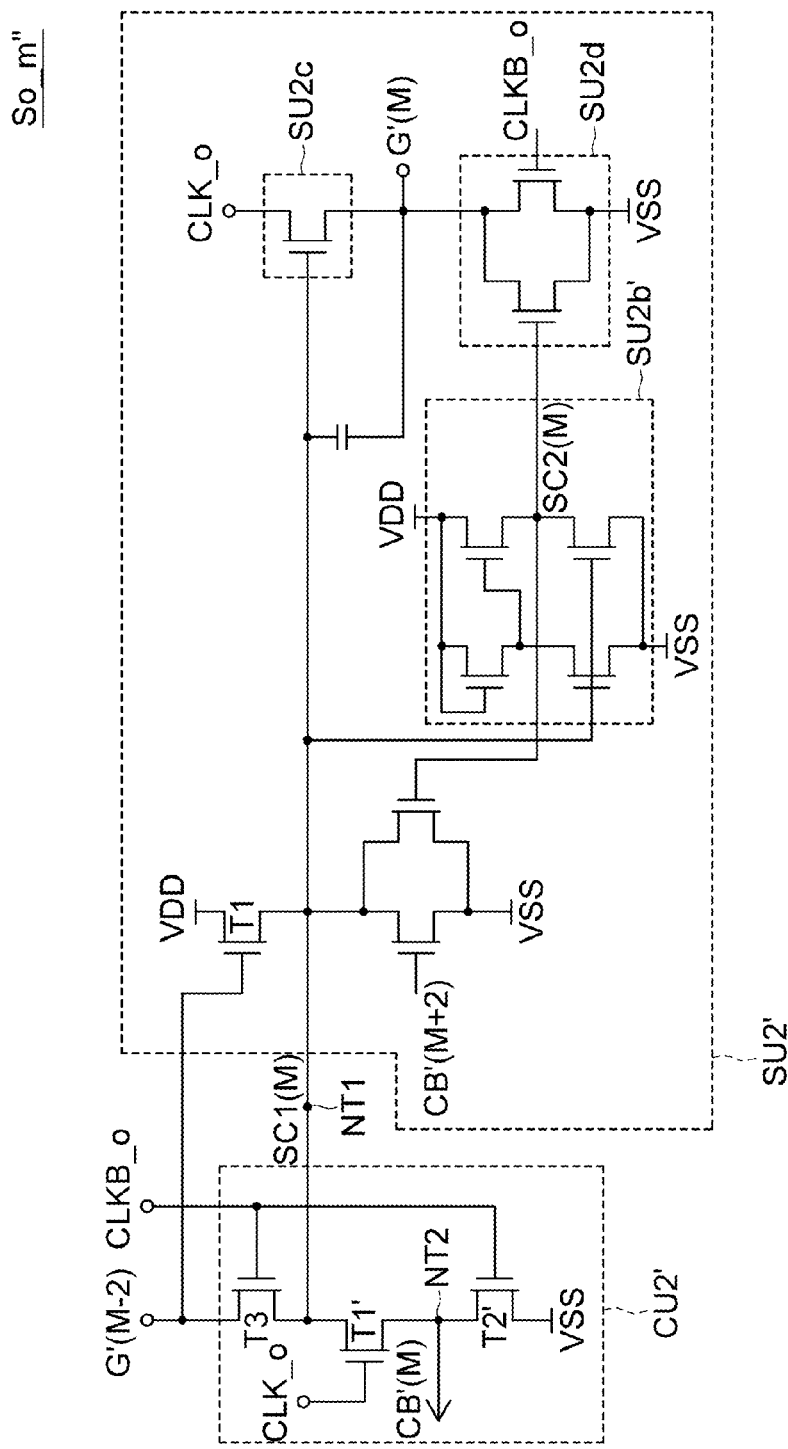
FIG. 15 shows yet another detailed circuit diagram of a shift register circuit of FIG. 10.
Figure 16:
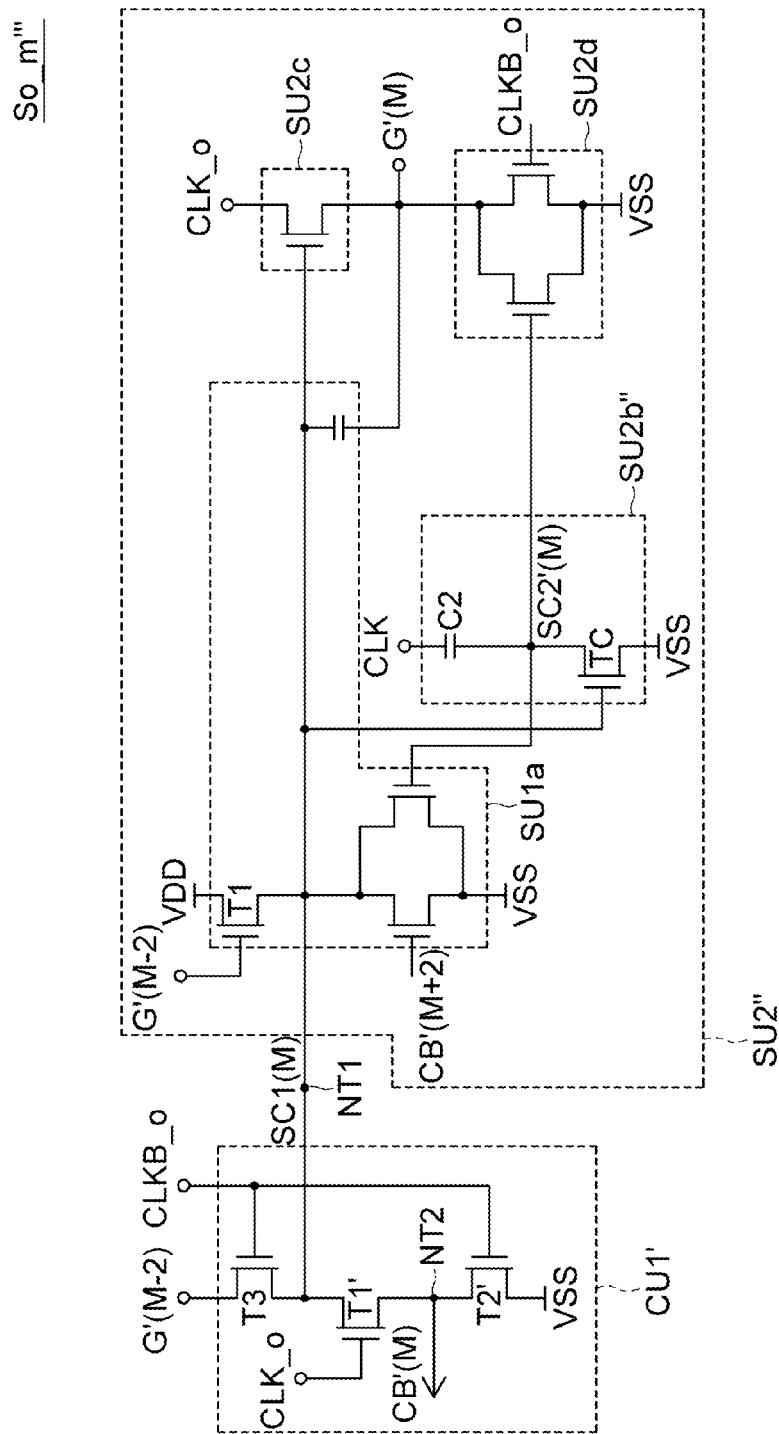
FIG. 16 shows yet another detailed circuit diagram of a shift register circuit of FIG. 10.
Figure 17:
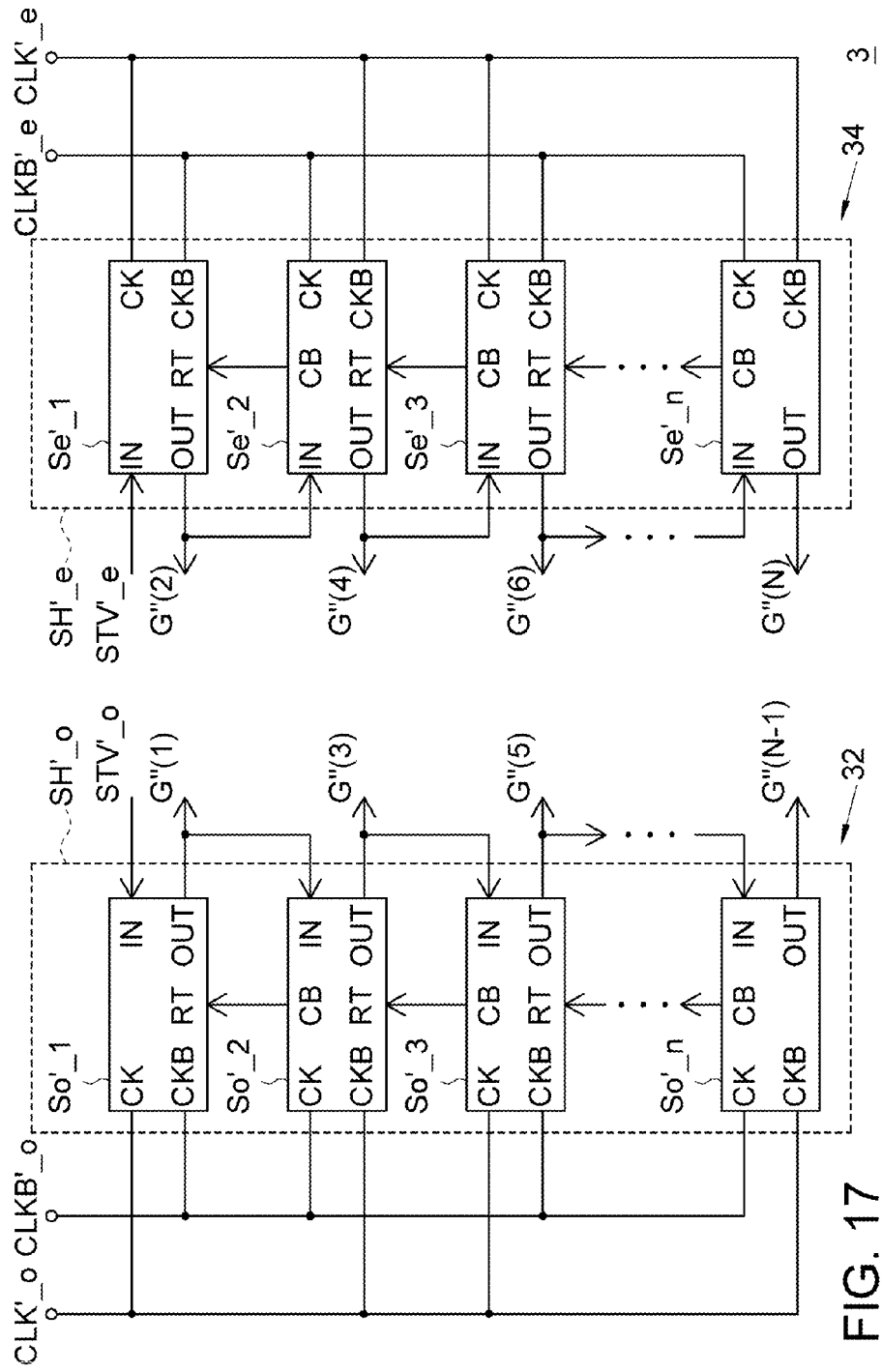
FIG. 17 shows another block diagram of a gate driver using a shift register of a second embodiment of the invention.
Figure 18:
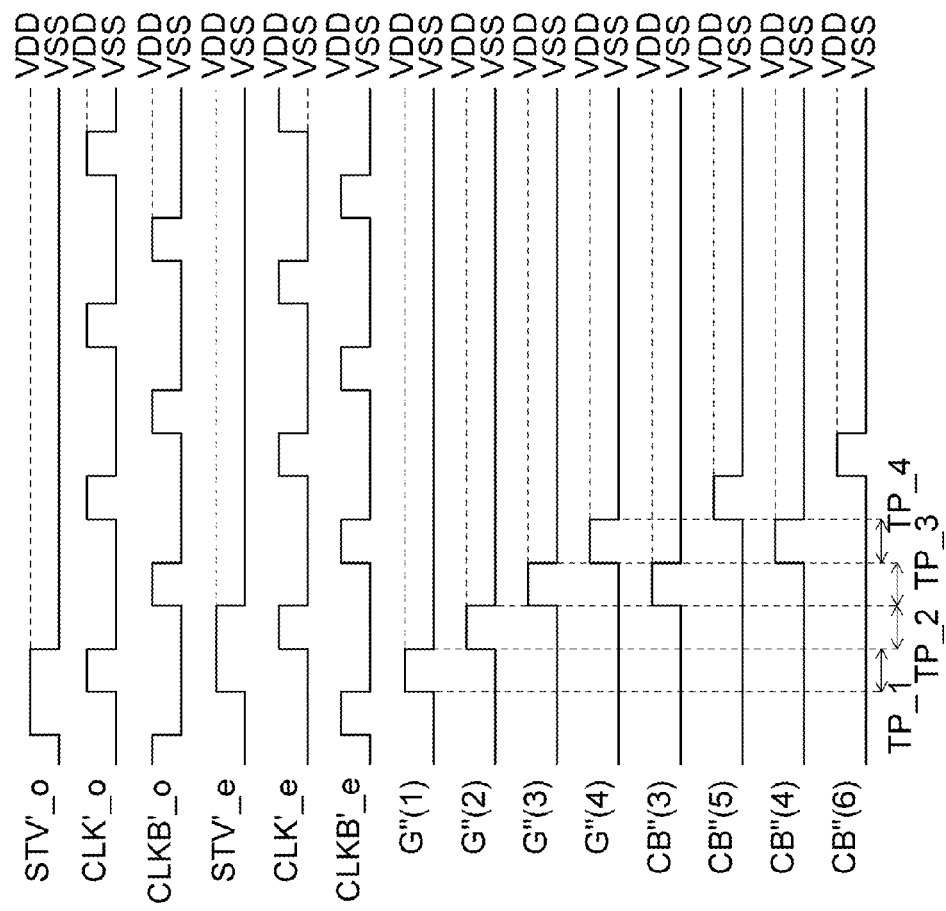
FIG. 18 shows a relevant signal clock diagram of a shift register of FIG. 17.
Figure 19:
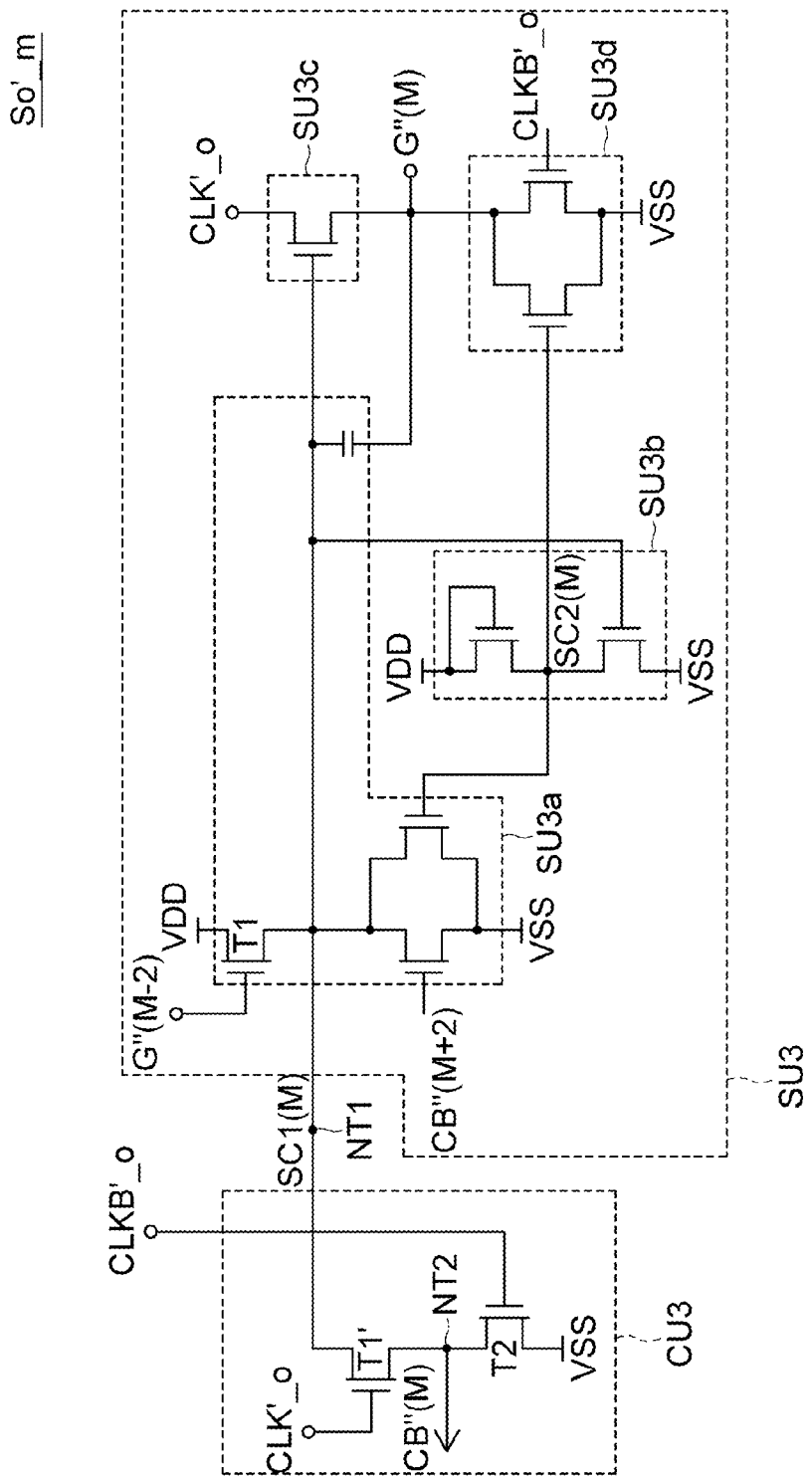
FIG. 19 shows a detailed circuit diagram of a shift register circuit of FIG. 17.
Figure 20:
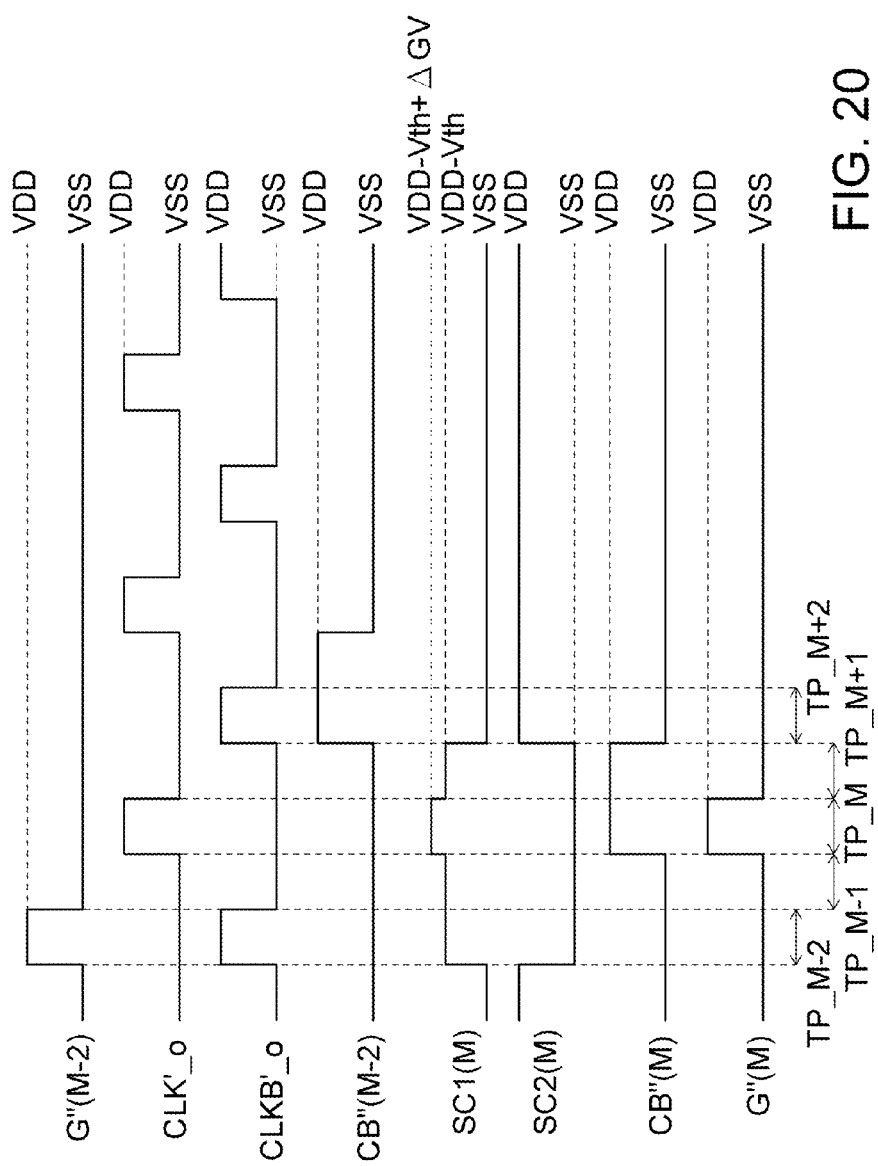
FIG. 20 shows a relevant signal clock diagram of a shift register circuit of FIG. 19.

Like the first embodiment, the shift register circuit So_m of the present embodiment of the invention can have some circuit adjustments as indicated in FIG. 14, FIG. 15 and FIG. 16.

In the present embodiment of the invention, the gate signals G' (1)~G' (N) have pre-charge function. However, the shift register 10 of the present embodiment of the invention is not limited to generating the gate signals G' (1)~G' (N) with pre-charge function. In another example, the gate driver 2 using the shift register of the present embodiment of the invention can also generate ordinary gate signals G" (1)~G" (N) without pre-charge function as indicated in FIG. 17, FIG. 18, FIG. 19 and FIG. 20. Thus, the shift register of the present embodiment of the invention can also be used in a dual-gate driver 3, and provide the gate signals G" (1)~G" (N) without pre-charge function.

In the shift register of the above embodiment of the invention, the shift register circuit of each stage includes a control circuit which provides a control signal for compensating the shift register circuit of the previous stage. Compared with the conventional shift register, the shift register of the invention has the advantages of effectively reducing the load for the output signal provided by the shift register circuit of each stage and improving the distortion occurring to the shift register circuit of each stage.

The gate driver using the shift register of the above embodiment of the invention can be used for driving the display panel with various forms of layout.

Figure 21:
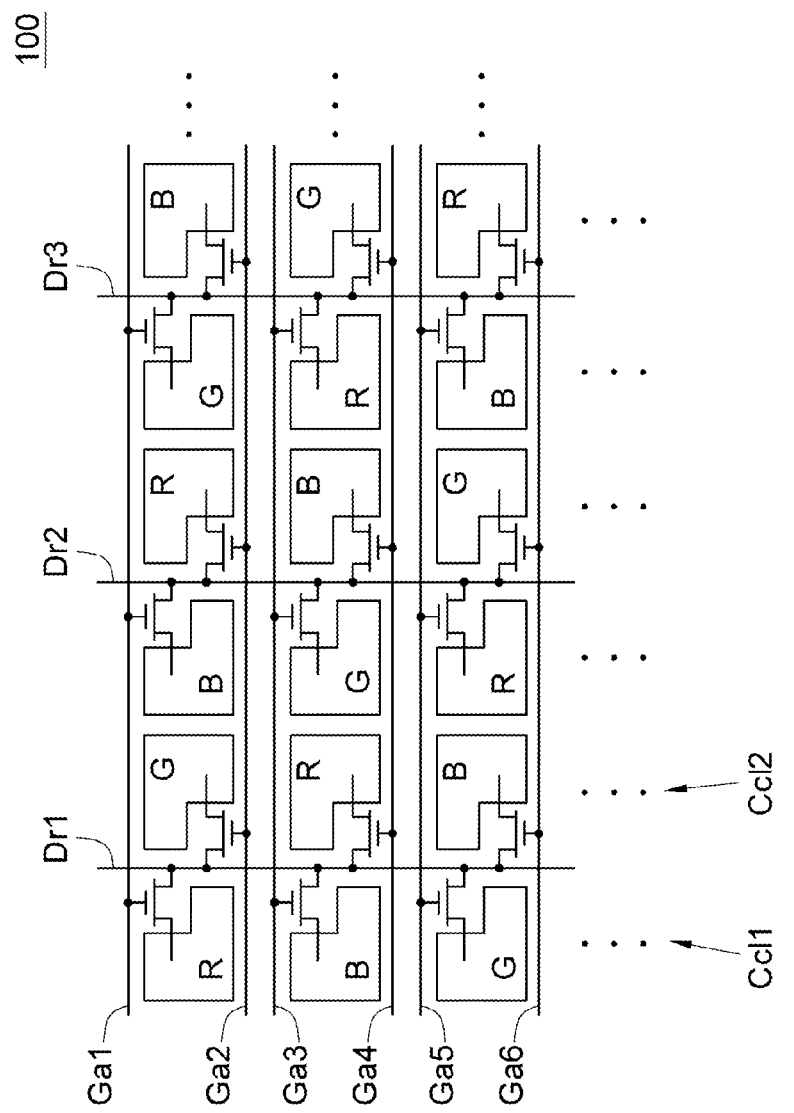
FIG. 21 shows a layout diagram of a display panel driven by a gate driver of the above embodiment of the invention.

Referring to FIG. 21, a layout diagram of a display panel driven by a gate driver of the above embodiment of the invention is shown. In an example, in a display panel 100, each of the data lines Dr1, Dr2 and Dr3 corresponds to two sub-pixel columns, and perform writing operation to the pixel data. For example, the data line Dr1 corresponds to the sub-pixel columns Ccl1 and Ccl2, wherein each sub-pixel of the sub-pixel column Ccl1 is controlled by the gate signal on the odd-order gate lines Ga1, Ga3 and Ga5 and is enabled, and each sub-pixel of the pixel column Ccl2 is controlled by the gate signal on the even-order gate line Ga2, Ga4 and Ga6 and is enabled. In other words, under the circumstance that the size of the corresponding pixel array is the same, the number of data lines needed in the display panel using the dual-gate layout (that is, the number of the output channel of the data driver) is only a half of the data lines needed in the conventional display panel, so that the cost of the data driver and the display are reduced correspondingly.

Figure 22:
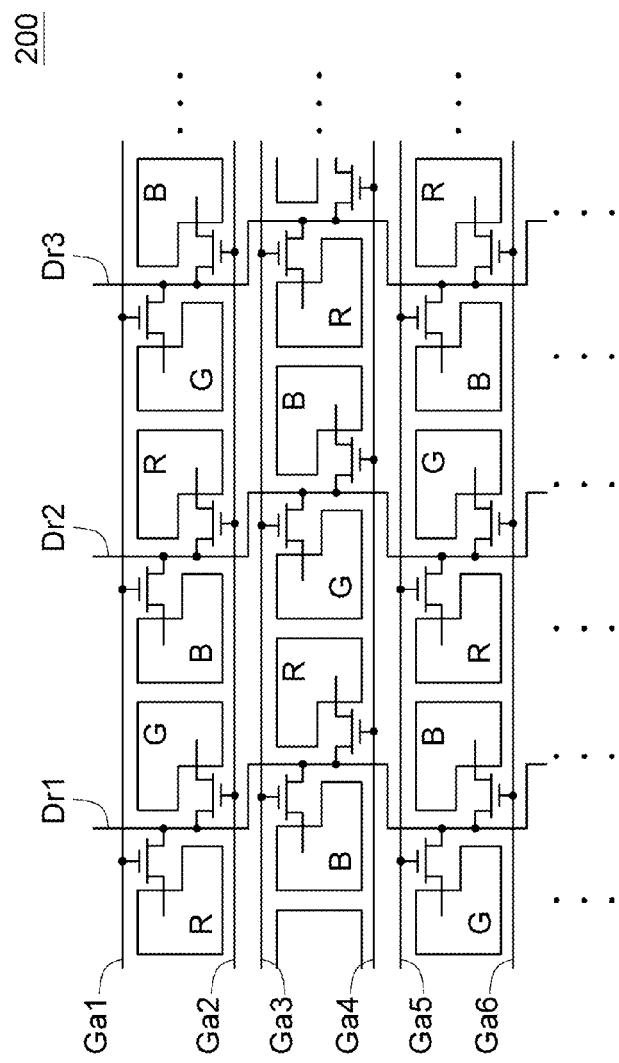
FIG. 22 shows another layout diagram of a display panel driven by a gate driver of the above embodiment of the invention.

Referring to FIG. 22, another layout diagram of a display panel driven by a gate driver of the above embodiment of the invention is shown. The display panel 200 of FIG. 22 differs with the display panel 100 of FIG. 21 in that the example of FIG. 22 further uses delta layout, so that the sub-pixels of two adjacent sub-pixel rows are differentiated by 1.5 sub-pixels.

Figure 23:
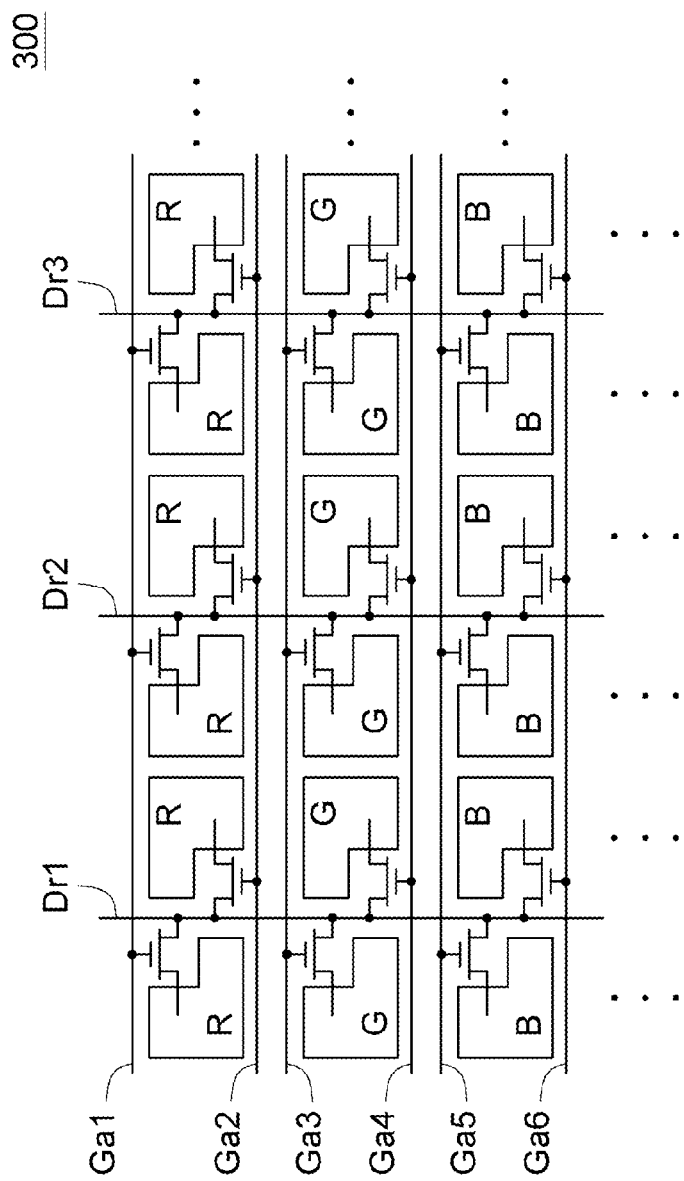
FIG. 23 shows yet another layout diagram of a display panel driven by a gate driver of the above embodiment of the invention.

Referring to FIG. 23, yet another layout diagram of a display panel driven by a gate driver of the above embodiment of the invention is shown. The display panel 300 of FIG. 23 differs with the display panel 100 of FIG. 21 in that the example of FIG. 23 uses triple-gate layout, wherein the three sub-pixels of each pixel are arranged in order along the direction of the data lines (not along the direction of the gate line). Thus, under the circumstance that the size of the corresponding pixel array is the same, the number of data lines needed in the display panel using the dual-gate and the triple-gate layout (that is, the number of the output channel of the data driver) is only a sixth of the data lines needed in the conventional display panel. Thus, the number of the output channel of the data driver of the display is reduced to a sixth, so that the cost of the data driver and the display are reduced correspondingly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register comprising a plurality of multi-stage shift register circuits respectively used for outputting a plurality of shift output signals, wherein an $m^{th}$ stage shift register circuit of the multi-stage shift register circuits comprises:

an $m^{th}$ stage first node, wherein an $m^{th}$ stage first control signal enabled in an $m^{th}$ period is defined on the $m^{th}$ stage first node;

an $m^{th}$ stage shift register unit controlled by a first clock signal and an $(m-1)^{th}$ stage output signal enabled in an $(m-1)^{th}$ period and provided by an $(m-1)^{th}$ stage shift register circuit, for providing an enabled $m^{th}$ stage output signal in the $m^{th}$ period, wherein the $m^{th}$ stage shift register unit further is controlled by an $(m+1)^{th}$ stage second control signal provided by an $(m+1)^{th}$ stage shift register circuit for providing the disenabled $m^{th}$ stage output signal in an $(m+1)^{th}$ period; and an $m^{th}$ stage control circuit controlled by the first clock signal for providing and outputting an $m^{th}$ stage second control signal to the $(m-1)^{th}$ stage shift register circuit according to the $m^{th}$ stage first control signal;

wherein m is a natural number greater than 1, the $m^{th}$ stage output signal is applied to an output line to drive a display panel, the output line is connected to the display panel and the (m+1)th stage shift register circuit, but is not connected to the previous stage shift register circuit, so that the $m^{th}$ stage shift register circuit does not provide the $m^{th}$ stage output signal to the previous stage shift register circuit;

wherein an output load of the $m^{th}$ stage shift register circuit does not include a load of the $(m-1)^{th}$ stage shift register circuit; and wherein the $m^{th}$ stage control circuit comprises:

a second node, wherein the $m^{th}$ stage second control signal is defined on the second node;

a first transistor, wherein a first input end is coupled to the $m^{th}$ stage first node, a second input end is coupled to the second node, and the control end receives the first clock signal; and a second transistor, wherein the first input end is coupled to the second node, the second input end receives a reference voltage signal, and the control end receives a second clock signal.

2. The shift register according to claim 1, wherein the $m^{th}$ stage control circuit further comprises:

a third transistor, wherein the first input end receives the $(m-1)^{th}$ stage output signal, the second input end is coupled to the $m^{th}$ stage first node, and the control end receives the second clock signal.

3. The shift register according to claim 2, wherein the first clock signal and the second clock signal are inversed.

4. The shift register according to claim 1, wherein the $(m+1)^{th}$ stage shift register circuit comprises:

an $(m+1)^{th}$ stage first node, wherein an $(m+1)^{th}$ stage first control signal enabled in the $(m+1)^{th}$ period is defined on the $(m+1)^{th}$ stage first node;

an (m+1)$^{th}$ stage shift register unit controlled by the m$^{th}$ stage output signal provided by the m$^{th}$ stage shift register circuit and a second clock signal for providing an enabled (m+1)$^{th}$ stage output signal in the (m+1)$^{th}$ period, wherein the (m+1)$^{th}$ stage shift register unit further is controlled by an (m+2)$^{th}$ stage second control signal provided by an (m+2)$^{th}$ stage shift register circuit for providing the disenabled (m+1)$^{th}$ stage output signal in an (m+2)$^{th}$ period; and an (m+1)$^{th}$ stage control circuit controlled by the second clock signal for providing and outputting the (m+1)$^{th}$ stage second control signal to the m$^{th}$ stage shift register circuit according to the (m+1)$^{th}$ stage first control signal.

5. The shift register according to claim 4, wherein the first clock signal and the second clock signal are inversed.

6. The shift register according to claim 1, wherein the (m−1)$^{th}$ stage shift register circuit comprises:

an (m−1)$^{th}$ stage first node, wherein an (m−1)$^{th}$ stage first control signal enabled in the (m−1)$^{th}$ period is defined on the (m−1)$^{th}$ stage first node;

an (m−1)$^{th}$ stage shift register unit controlled by the (m−2)$^{th}$ stage output signal provided by the (m−2)$^{th}$ stage shift register circuit and a second clock signal for providing an enabled (m−1)$^{th}$ stage output signal in the (m−1)$^{th}$ period, wherein the (m−1)$^{th}$ stage shift register unit further is controlled by the m$^{th}$ stage second control signal provided by the m$^{th}$ stage shift register circuit for providing the disenabled (m−1)$^{th}$ stage output signal in the m$^{th}$ period; and an (m−1)$^{th}$ stage control circuit controlled by the second clock signal for providing and outputting the (m−1)$^{th}$ stage second control signal to the (m−2)$^{th}$ stage shift register circuit according to the (m−1)$^{th}$ stage first control signal.

7. The shift register according to claim 6, wherein the first clock signal and the second clock signal are inversed.

8. The shift register according to claim 1, wherein the m$^{th}$ stage shift register unit comprises:

a first level control unit used for providing a first clock signal as the m$^{th}$ stage output signal;

a first driving unit, wherein the first driving unit and an input end of the first level control unit are coupled to the m$^{th}$ stage first node, and the first driving unit is used for turning on the first level control unit in the m$^{th}$ and the (m+1)$^{th}$ period and turning off the first level control unit in the (m+2)$^{th}$ period in response to the front edge of the (m−1)$^{th}$ stage output signal according to the (m+1)$^{th}$ stage second control signal;

a second level control unit used for providing a reference voltage signal as the m$^{th}$ stage output signal; and a second driving unit used for disenabling the second level control unit in the (m−1)$^{th}$ period and the m$^{th}$ period in response to the front edge of the m$^{th}$ stage first control signal and turning on the second level control unit in response to the rear edge of the m$^{th}$ stage first control signal.

9. The shift register according to claim 1, wherein the (m−1)$^{th}$ stage, the m$^{th}$ stage and the (m+1)$^{th}$ stage output signal respectively drive a j$^{th}$ row, a (j+1)$^{th}$ row and a (j+2)$^{th}$ row of pixels of the display panel, and j is an odd number.

10. The shift register according to claim 1, wherein the (m−1)$^{th}$ stage, the m$^{th}$ stage and the (m+1)$^{th}$ stage output signal respectively drive an j$^{th}$ row, an (i+1)$^{th}$ row and an (i+2)$^{th}$ row of pixels of the display panel, and i is an even number.

11. The shift register according to claim 1, wherein the plurality of shift output B signals provided by the shift register circuits are used for driving the gate signals of a display panel, the (m−1)$^{th}$ stage, the m$^{th}$ stage and the (m+1)$^{th}$ stage output signal respectively drive a k$^{th}$ row, a (k+1)$^{th}$ row and a (k+2)$^{th}$ row of pixels of the display panel, and k is an odd number.

12. A gate driver used for driving a display panel, wherein the gate driver comprises:

a shift register comprising a plurality of multi-stage shift register circuits respectively used for outputting a plurality of shift output signals, wherein an m$^{th}$ stage shift register circuit of the multi-stage shift register circuits comprises:

an m$^{th}$ stage first node, wherein an m$^{th}$ stage first control signal enabled in an m$^{th}$ period is defined on the m$^{th}$ stage first node;

an m$^{th}$ stage shift register unit controlled by a first clock signal and an (m−1)$^{th}$ stage output signal provided by an (m−1)$^{th}$ stage shift register circuit and enabled in an (m−1)$^{th}$ period, for providing an enabled m$^{th}$ stage output signal in the m$^{th}$ period, wherein the m$^{th}$ stage shift register unit further is controlled by an (m+1)$^{th}$ stage second control signal provided by an (m+1)$^{th}$ stage shift register circuit for providing the disenabled m$^{th}$ stage output signal in an (m+1)$^{th}$ period; and an m$^{th}$ stage control circuit controlled by the first clock signal for providing and outputting an m$^{th}$ stage second control signal to the (m−1)$^{th}$ stage shift register circuit according to the m$^{th}$ stage first control signal;

wherein m is a natural number greater than 1, the m$^{th}$ stage output signal is applied to an output line to drive a display panel, the output line is connected to the display panel and the (m+1)$^{th}$ stage shift register circuit, but is not connected to the previous stage shift register circuit, so that the m$^{th}$ stage shift register circuit does not provide the m$^{th}$ stage output signal to the previous stage shift register circuit;

wherein an output load of the m$^{th}$ stage shift register circuit does not include a load of the (m−1)$^{th}$ stage shift register circuit; and wherein the m$^{th}$ stage control circuit comprises:

a second node, wherein the m$^{th}$ stage second control signal is defined on the second node;

a first transistor, wherein a first input end is coupled to the m$^{th}$ stage first node, a second input end is coupled to the second node, and the control end receives the first clock signal; and a second transistor, wherein the first input end is coupled to the second node, the second input end receives a reference voltage signal, and the control end receives a second clock signal.

13. The gate driver according to claim 12, wherein the m$^{th}$ stage control circuit further comprises:

a third transistor, wherein the first input end receives the (m−1)$^{th}$ stage output signal, the second input end is coupled to the m$^{th}$ stage first node, and the control end receives the second clock signal.

14. The gate driver according to claim 13, wherein the first clock signal and the second clock signal are inversed.

15. The gate driver according to claim 12, wherein the display panel uses dual-gate layout.

16. The gate driver according to claim 12, wherein the display panel uses triple-gate layout.

17. The gate driver according to claim 12, wherein the display panel uses delta layout.

* * * * *